United States Patent
Kiendl et al.

(10) Patent No.: US 7,932,599 B2
(45) Date of Patent: Apr. 26, 2011

(54) SEMICONDUCTOR COMPONENT OF SEMICONDUCTOR CHIP SIZE WITH FLIP-CHIP-LIKE EXTERNAL CONTACTS

(75) Inventors: Helmut Kiendl, Koefering (DE); Horst Theuss, Wenzenbach (DE); Michael Weber, Mainburg (DE)

(73) Assignee: Sony Corporation (JP)

( * ) Notice: Subject to any disclaimer, the term of this patent is extended or adjusted under 35 U.S.C. 154(b) by 451 days.

(21) Appl. No.: 11/608,981

(22) Filed: Dec. 11, 2006

(65) Prior Publication Data

US 2007/0090535 A1 Apr. 26, 2007

Related U.S. Application Data

(62) Division of application No. 10/896,993, filed on Jul. 23, 2004, now Pat. No. 7,163,843.

(30) Foreign Application Priority Data

Jul. 24, 2003 (DE) .................. 103 33 841

(51) Int. Cl.
  *H01L 23/52* (2006.01)
  *H01L 23/48* (2006.01)
(52) U.S. Cl. ........ 257/737; 257/777; 257/778; 257/780; 257/781; 257/783; 438/114; 438/616
(58) Field of Classification Search .................. 257/737, 257/778, 738, 780, 781, 783, 777; 438/114, 438/616
See application file for complete search history.

(56) References Cited

U.S. PATENT DOCUMENTS

| 4,769,272 | A | 9/1988 | Byrne et al. |
| 5,918,113 | A | 6/1999 | Higashi et al. |
| 5,923,954 | A | 7/1999 | Cho |
| 6,046,071 | A | 4/2000 | Sawai et al. |
| 6,285,079 | B1 | 9/2001 | Kunikiyo |
| 6,916,732 | B2 * | 7/2005 | Wu et al. ........................ 438/613 |
| 2001/0016400 | A1 | 8/2001 | Lee |
| 2003/0094695 | A1 * | 5/2003 | Hedler et al. ................. 257/737 |
| 2003/0102538 | A1 | 6/2003 | Paulus |
| 2003/0106924 | A1 * | 6/2003 | Nobori et al. ............ 228/180.22 |

FOREIGN PATENT DOCUMENTS

| DE | 10105351 A1 | 8/2002 |
| WO | WO0126146 A1 | 4/2001 |

* cited by examiner

*Primary Examiner* — Kenneth A Parker
*Assistant Examiner* — Fang-Xing Jiang
(74) *Attorney, Agent, or Firm* — Edell, Shapiro & Finnan, LLC

(57) ABSTRACT

A semiconductor component and a method for its production in semiconductor chip size, can have a semiconductor chip, which has external contacts of the semiconductor component that are arranged in the manner of a flip-chip on its active upper side. The semiconductor chip can be encapsulated by a plastic compound at least on its rear side and its side edges. The outer contacts, which can be arranged on external contact connecting areas, can project from the active upper side.

12 Claims, 5 Drawing Sheets

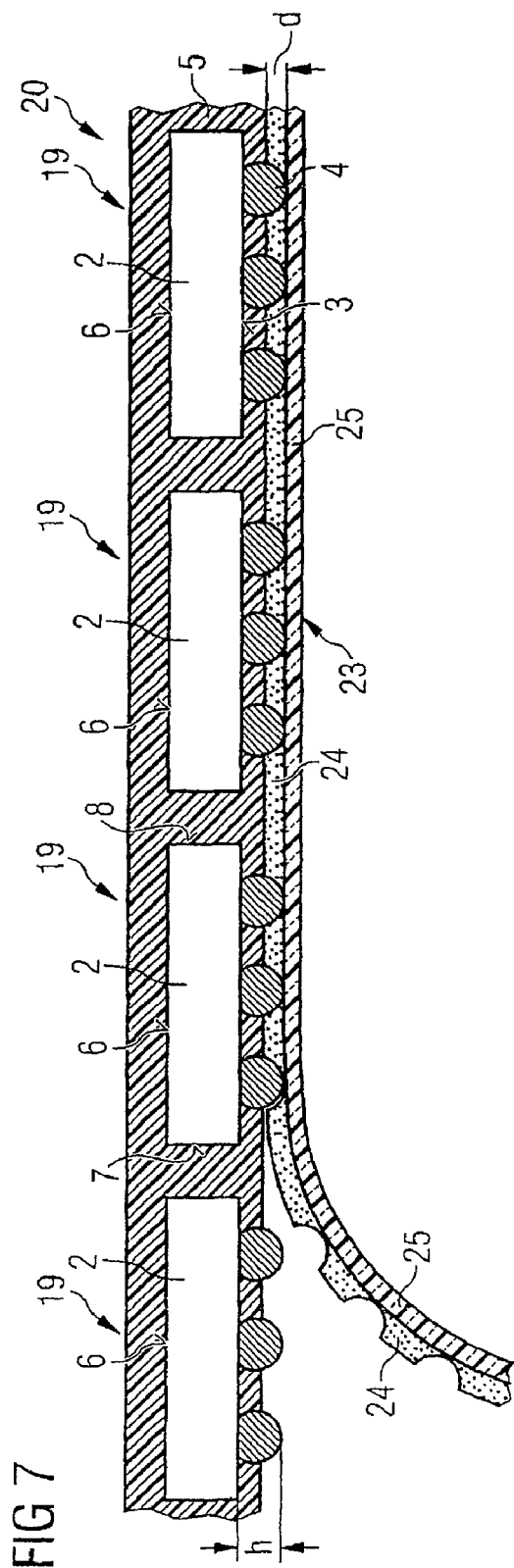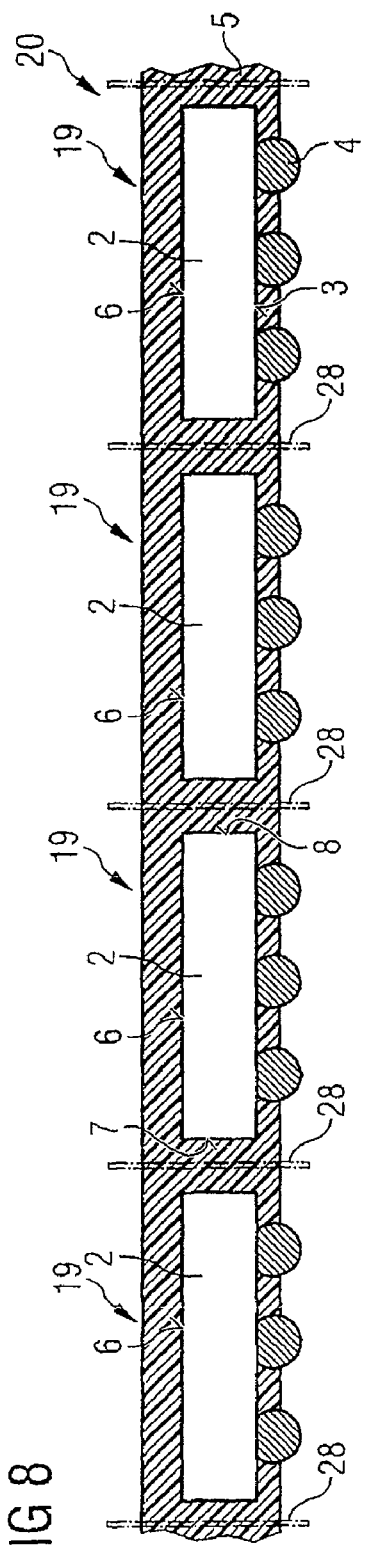

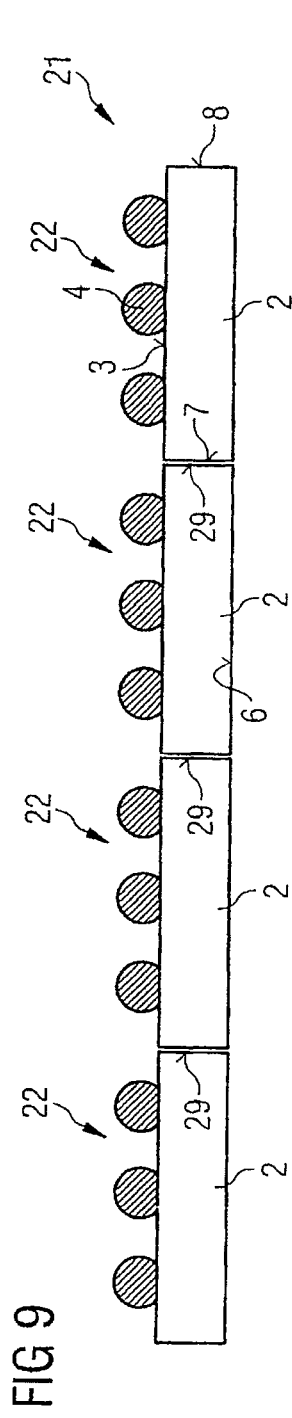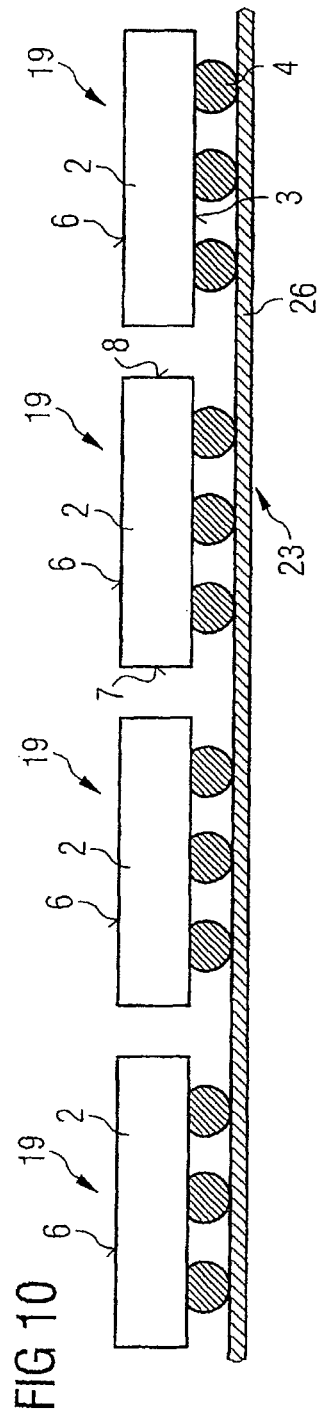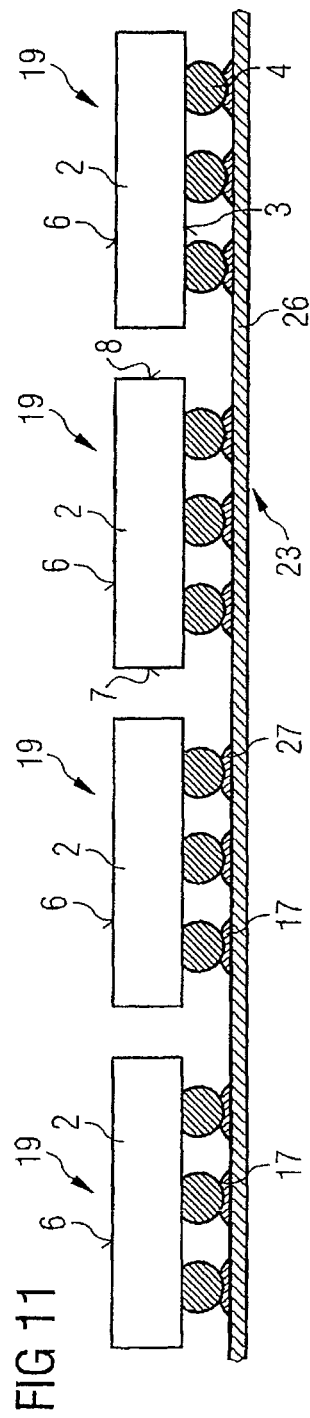

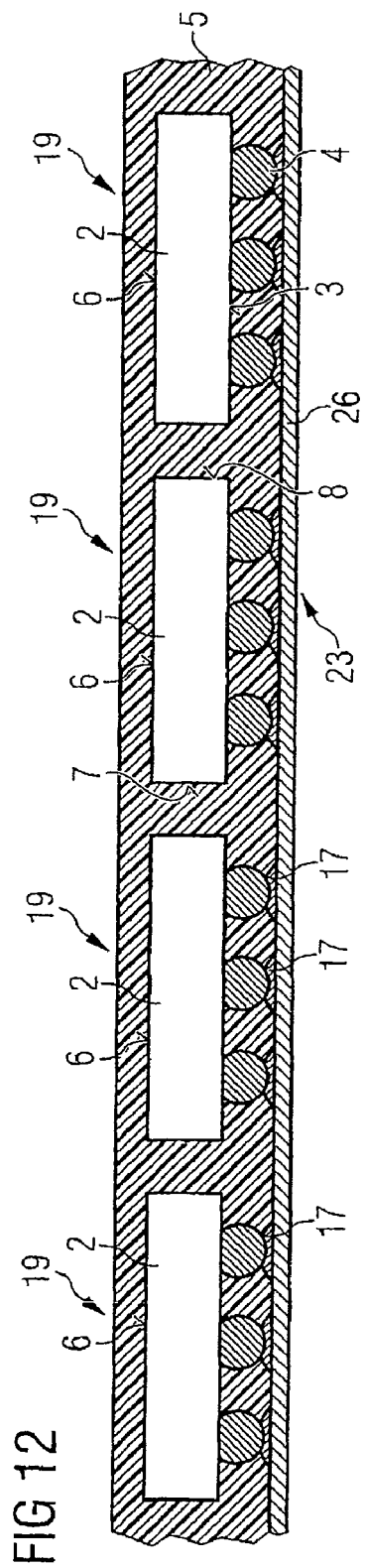
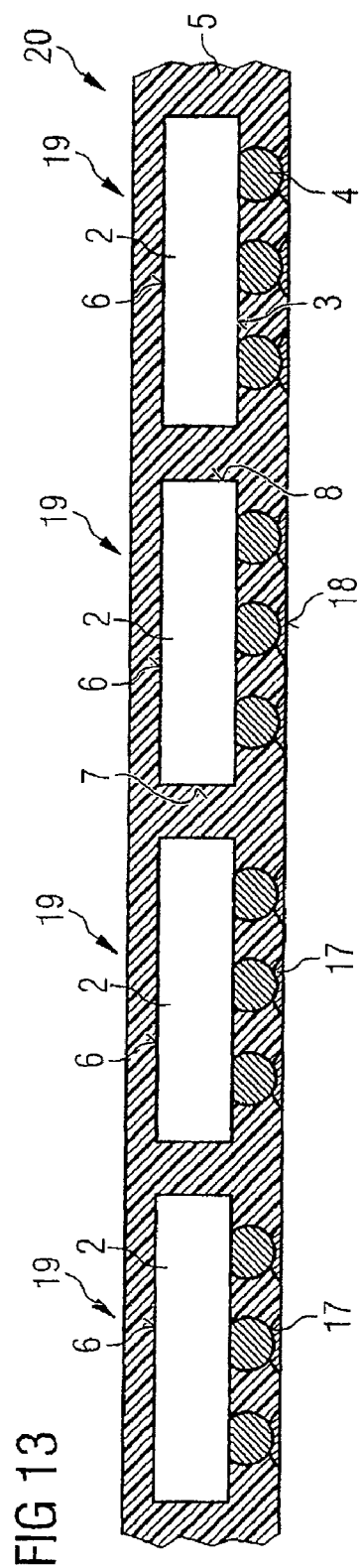
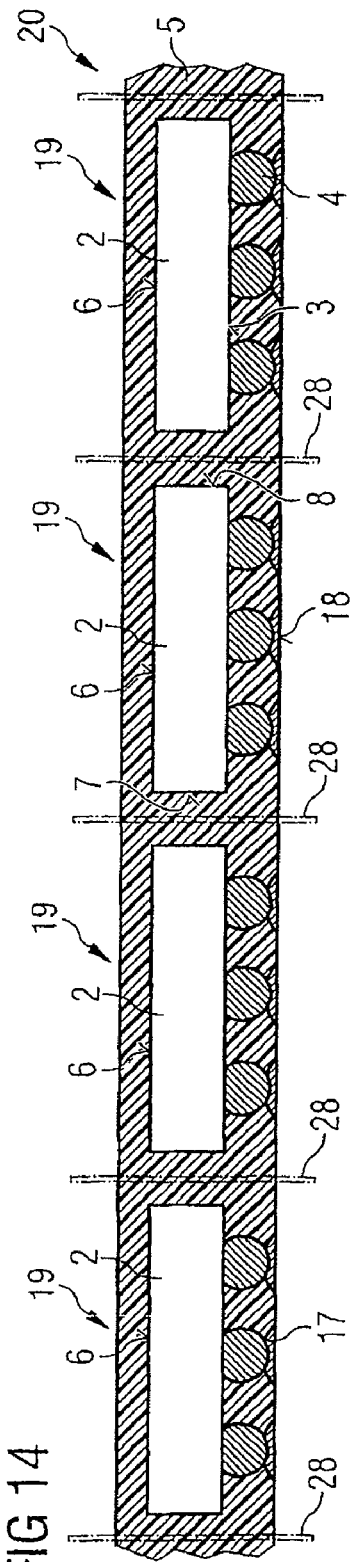

SEMICONDUCTOR COMPONENT OF SEMICONDUCTOR CHIP SIZE WITH FLIP-CHIP-LIKE EXTERNAL CONTACTS

CROSS REFERENCE TO RELATED APPLICATIONS

This application is a divisional of U.S. patent application Ser. No. 10/896,993, filed 23 Jul. 2004 and entitled "Semiconductor Component of Semiconductor Chip Size with Flip-Chip-Like External Contacts, and Method of Producing the Same", which claims priority under 35 U.S.C. §119 to German Application No. DE 103 33 841.1, filed 24 Jul. 2003 and entitled "Semiconductor Component of Semiconductor Chip Size with Flip-Chip-Like External Contacts, and Method of Producing the Same". The disclosures of the aforementioned documents are hereby incorporated by reference in their entireties.

FIELD OF THE INVENTION

The invention relates to a semiconductor component of semiconductor chip size having a semiconductor chip which has flip-chip-like external contacts, and to a method of producing the same.

BACKGROUND

Semiconductor components, which are known as flip-chip components or as WLP (wafer level package) components, are fitted with their flip-chip contacts as bare semiconductor chips to primary circuit boards, or are covered with a thin protective polymer layer before being fitted to the primary circuit board.

One disadvantage of such semiconductor components is their high sensitivity with respect to impact loadings or with respect to alternating temperature stresses. Furthermore, the large-area rear sides of the semiconductor components are exposed to erosive environmental influences and endangered, in particular, during maintenance and overhaul. In addition, the polymer layers cannot eliminate the problems of the low mechanical load bearing ability of these components.

A semiconductor component of semiconductor chip size which can be subject to increased mechanical loading and is reliably protected against erosive attack by the environment is desirable. Furthermore, a method of producing such reliable components economically, i.e., suitable for mass production, is desirable.

SUMMARY

According to the invention, a semiconductor component of semiconductor chip size can have a semiconductor chip, which can have external contacts that are arranged in the manner of a flip-chip on its active upper side. At least on its rear side and its side edges, the semiconductor chip can be encapsulated by a plastic compound. The external contacts can be arranged on external contact connecting areas. In this context, a semiconductor component of semiconductor chip size can mean, for example, a semiconductor component, which, in addition to the dimensions of a semiconductor chip, can include a minimum encapsulation of a plastic compound, for example, an epoxy resin. As compared with a semiconductor component including a bare chip with flip-chip external contacts, a semiconductor component of this type, firstly, can have dimensions of the external contacts relatively larger than pure flip-chip contacts, which, in the case of conventional semiconductor components, are connected electrically within a housing compound, for example, via a flat conductor frame with external contacts. To this extent, the expression "flip-chip-like" refers to the fact that the external contacts are arranged in the region of the active upper side of a semiconductor chip. In addition, for the arrangement of the external contacts with this invention, external contact connecting areas, which have a relatively larger connecting area than the contact areas, which are arranged directly on the active upper side of the semiconductor chip, and which are connected electrically to the electrodes of the semiconductor elements of an integrated circuit via conductor tracks, can be made available. The semiconductor component according to the invention differs from semiconductor components, which have semiconductor chips with flip-chip contacts and also from semiconductor components, which correspond to the semiconductor chip size and may be covered with a protective polymer layer a few microns thick. In this case, the active upper side having the external contact connecting areas and the external contacts can be relatively free of plastic compound of epoxy resin. Nevertheless, due to the encapsulation of the rear sides and the side edges of the semiconductor chip with a plastic compound, for example, as is commonly used for semiconductor component housings, a semiconductor component of semiconductor chip size can now also be covered with the impact-resistant and alternating temperature-resistant and erosion-resistant plastic compound.

In an embodiment of the invention, the external contacts can be encapsulated by plastic compound to at least half of their height. In this case, the encapsulation of the plastic compound can also extend on to the active upper side of the semiconductor chip and can surround at least half the upper side of each external contact, so that the external contacts can be embedded like teeth in gums. Thus, the bottom region of each external contact can experience additional support. This additional support can prevent the external contacts tearing off the external contact connecting areas, for example, in particular, under cyclic alternating thermal stress. Thus, semiconductor components of this type can be relatively resistant to shear stress arising from different expansion coefficients of the semiconductor chip and of a primary circuit board, on which the semiconductor components according to the invention can be arranged without damage.

Furthermore, in the case of the semiconductor component according to the invention, the active upper side of the semiconductor chip can carry a rewiring layer. The size of the area of this active rewiring layer can correspond to the size of the area of the active upper side of the semiconductor chip. Consequently, this rewiring layer may not be conceived for the purpose of enlarging the available active upper side of the semiconductor chip for correspondingly large external contact connecting areas, and therefore, may not project beyond the active upper side of the semiconductor chip either. The rewiring layer itself can be built up from at least three layers. A first layer can be an insulating layer with through contacts to contact areas on the active upper side of the semiconductor chip. A second layer can form a rewiring layer with a rewiring structure, which can have rewiring lines and external contact connecting areas. The rewiring lines can connect the external contact connecting areas to the through contacts in the first layer of the rewiring layer. A third layer can be an insulating layer, which can protect the rewiring lines and can leave windows for the external contact connecting areas free, in which windows external contacts can then be arranged. This arrangement of the external contacts, similar to the application of the rewiring layer, can already be carried out on a semiconductor wafer, so that, in order to form an electronic component according to the invention, encapsulation of the individual semiconductor chips needs to be carried out.

Furthermore, the external contacts can also be embedded completely in plastic compound and can have a solder deposit, which can project out of the plastic compound as an external contact area. In the case of such a design, the external contacts can be produced from a gold alloy and the solder deposit can have a lead-free tin alloy. The external contacts themselves can have their dimension reduced, while the final size of the external contact can be determined by the solder deposit. Furthermore, the external contacts will not likely tear off the external contact connecting areas on the semiconductor chip, and can thus be a very reliable semiconductor component.

Instead of the solder alloy, the external contact can also be formed as a resilient external contact. The core of the external contact can have a resilient material. This resilient core material may be partly covered by a metal layer as an external contact area. External stresses, in particular, for example, shear stresses, on the external contact connecting areas can be transmitted to the rewiring layer in much resilient external contacts.

Further alternate embodiments of the external contacts can include solder bumps. The entire external contact being produced from a solder compound which has been applied with the aid of a stencil, for example. Moreover, the external contacts can also include electrodeposited or chemically deposited bumps which, because of the electrodeposition or chemical deposition, can be configured in terms of their contours. Another alternate is for the external contacts to include stud bumps. Stud bumps of this type are thermocompression heads, which are applied successively to the external contact connecting areas by a bonding operation. Stud bumps of this type can have, as material, the material of bonding wires which form the thermocompression heads or the stud bumps during thermocompression bonding. In this case, however, it is necessary to take account of the fact that solder bumps or electrodeposited or chemically deposited bumps can be produced simultaneously in one method step on the active upper side of a semiconductor chip, while stud bumps including thermocompression heads can be applied to the semiconductor chips one after another.

A further aspect of the invention relates to a blank which can have component positions for semiconductor components arranged in rows and columns. A blank of this type for the component according to the invention differs from conventional blanks in that the distance between the component positions arranged in rows and columns can be sized so that a saw blade can be led through the blank between the rows and columns having semiconductor chips without exposing the side edges of the semiconductor chips. Instead, the intention is for a plastic compound to remain on the side edges of the semiconductor chips so that the side edges of the semiconductor chips can remain covered by the plastic compound.

A method of producing semiconductor chips with flip-chip-like external contacts from a semiconductor wafer having semiconductor chip positions arranged in rows and columns can have the following method steps. Firstly, a semiconductor wafer having a plurality of semiconductor chip positions arranged in rows and columns can be provided. Integrated circuits can be arranged in the semiconductor chip positions. Their electrodes of the integrated circuits can be connected via conductor tracks to contact areas on the upper side of the semiconductor wafer. Next, external contact connecting areas in the semiconductor chip positions on active upper sides of the integrated circuits can be provided by the production of a rewiring layer. Then, flip-chip-like external contacts can be applied to the external contact connecting areas of the rewiring layer in the semiconductor chip positions. A semiconductor wafer of this type can then be populated with external contacts on one side and can be divided up into individual semiconductor chips with flip-chip-like external contacts.

The external contacts can be produced simultaneously on a semiconductor wafer for many semiconductor chip positions. Additionally, a functional test of each individual semiconductor chip can be carried out with adapted sensing systems in the semiconductor chip positions of the semiconductor wafer. Semiconductor chip positions, which do not have a functional semiconductor chip, can be marked during this functional test and may then not be further processed. Without application of the external contacts, it would be necessary for substantially more complex test instruments to be used in order to be able to connect the external contact connecting areas to appropriate evaluation instruments by using appropriate multiple-tip probes.

In order to produce external contact connecting areas, first an insulating layer can be applied to the semiconductor wafer. This insulating layer can have through openings to the contact areas on the active upper sides of the integrated circuits. A structured rewiring layer with through contacts to the contact areas on the upper side of the integrated circuit, with external contact connecting areas, and with rewiring leads as connecting lines between the external contact connecting areas and the contact areas, can then be produced. For this purpose, first the upper side of the semiconductor wafer can be metallized and then, by photolithography, the structures with through contacts, rewiring lines, and external contact connecting areas can be produced from a corresponding metal layer. In order to terminate the rewiring layer, an insulating layer can be applied, which can protect the rewiring lines and through contacts, but in which windows to the external contact connecting areas can remain free. Since this sequence of layers for a rewiring layer can be carried out directly on the semiconductor wafer, rewiring layers, which have the same size area as the active upper sides of the semiconductor chips, can be produced when the semiconductor wafer can be divided up into individual semiconductor chips. Consequently, the rewiring layers may not be larger nor smaller than the active upper side of the semiconductor chips.

A further aspect of the invention relates to a method of producing a blank having component positions arranged in rows and columns. Firstly, semiconductor chips with flip-chip-like external contacts, as described above, can be produced. Then, these semiconductor chips with their flip-chip-like external contacts can be applied to an auxiliary carrier and fixed to the auxiliary carrier. This application of semiconductor chips may be carried out in rows and columns, while maintaining a spacing between the semiconductor chips. The spacing between the semiconductor chips, for example, can correspond to at least twice a saw blade thickness of a saw blade with which the blank can be divided into individual semiconductor components. Following the fixing of the semiconductor chips to the auxiliary carrier, a plastic compound can be applied to the auxiliary carrier, embedding the semiconductor chips with their flip-chip-like external contacts. The auxiliary carrier can then be removed, exposing the contact areas between external contacts and auxiliary carrier. The contact areas between auxiliary carrier and external contacts can thus form external contact areas, which can be freely accessible, so that functional tests can be carried out on the individual components in the component position of the blank. A board-like composite element can be produced as a blank, which can be produced from plastic on its one side and can have a plastic area on its other side, which can show contact areas in the positions of the external contacts. In one exemplary implementation of the method, the auxiliary carrier can be a plastic film coated with adhesive. The external contacts of the individual semiconductor chips in the corresponding component positions can be pressed into this adhesive so that the upper side of the external contacts, which can be pressed into the adhesive layer, can later form the external contact areas which project from the plastic compound. Depending on the thickness of the adhesive layer, a relatively larger or smaller proportion of the external contacts can contribute to forming the external contact areas. In the extreme case, the adhesive layer can be so thick that the external contacts may disappear into the adhesive layer, which means that, when the auxiliary carrier with the adhesive layer is removed, the external contacts can be free of the plastic compound to be applied. Consequently, by using this method, the level of embedding of the external contacts in a plastic compound can be adjusted.

A further possible way of producing a blank includes using a metal plate as the auxiliary carrier and the external contacts of the semiconductor chip being soldered to the metal plate when the semiconductor chips are fixed to the auxiliary carrier. Following application of the plastic compound, which then encloses the external contacts completely, but does not wet the contact area between solder material and metal plate, solder can remain as a solder deposit after the metal plate is removed, forming external contact areas on the embedded external contacts. A solder deposit for the further processing of the semiconductor component can be made available in each external contact position, which can make further processing easier. While the plastic film with adhesive layer can be pulled off the blank as a result of heating, the metal plate, as auxiliary carrier, can be removed by wet or dry etching until the individual solder deposits are exposed.

The blank produced in this way with the component positions arranged in rows and columns can be divided up into individual semiconductor components by a saw blade being led through between the rows and columns of the semiconductor chips in the sawing tracks provided. If the aforementioned minimum spacing is maintained, the side edges of each semiconductor chip of the semiconductor components of semiconductor chip size can be encapsulated by the plastic compound of at least half the thickness of a saw blade.

In summary, a semiconductor chip with "bumps" can be pressed into an adhesive film so that the bumps can relatively vanish into the adhesive layer. After that, the arrangement can be encapsulated with plastic and the film can then be removed, i.e., pulled off. After the film has been pulled off, the blank produced can be separated to form "packages". Alternatively, instead of the adhesive film, a "lead frame", for example, in the form of a copper sheet, can be used. In this case, wetting of the bumps with the lead frame can be forced by a soldering process. Otherwise, the method steps of the alternates are similar. Thus, a semiconductor housing for a semiconductor component with flip-chip-like external contacts can be produced, which can be encapsulated with plastic apart from the external electrical contacts. Optionally, the active area of the semiconductor chip can also remain relatively free of plastic, specifically, if the bumps are pressed completely into the adhesive layer of the plastic film. Thus, "back side protection" for the protection of the rear side of the semiconductor chip can be achieved in a simple and inexpensive manner. In summary, by using this method and the semiconductor components resulting from this, the following advantages result:

1. Better anchoring of the electric contacts on the semiconductor chip as a result of partial encapsulation of the external contacts with plastic. In particular, on the chip side, in reliability tests the typical intended fracture point is located at the transition from semiconductor chip to the external contacts, which can be protected or reinforced by the partial encapsulation with plastic.
2. An inexpensive and simple method of implementing the rear side protection required by customers for semiconductor components of semiconductor chip size.
3. An implementation of a simple housing with flip-chip-like external contacts which, in one method pass, permits rear side protection with the protection of the active side and, moreover, with improved adhesion of the electric contacts to the active upper side of the semiconductor chips.
4. Under certain circumstances, it is possible to dispense with an otherwise customary "underfill" during application to a primary circuit board.
5. The invention can permit an effective and economical method, since it is possible to work in an "array", for example, on strips with a magazine handling system or else at the wafer level with a wafer blank. Moreover, the method according to the invention can even be implemented as a linked "reel-to-reel concept", by die bonding on film with subsequent molding and pulling off the film being carried out as a linked process.
6. A miniaturized plastic housing for semiconductor technology can be implemented.
7. This semiconductor housing can be reliable as a result of the use of a specific molding process, i.e., the "array molding" of semiconductor chips with bumps pressed completely or partly into adhesive film.

BRIEF DESCRIPTION OF THE FIGURES

The invention will now be explained in more detail using the appended figures, in which FIG. 7 shows a schematic cross section through semiconductor chips according to FIG. 6 during the removal of the auxiliary carrier, FIG. 8 shows a schematic cross section through a blank with external contacts partly embedded in plastic compound, FIG. 9 shows a schematic cross section through a semiconductor wafer for producing a semiconductor component according to the third embodiment of the invention, FIG. 10 shows a schematic cross section through semiconductor chips with external contacts on a metal plate as auxiliary carrier, FIG. 11 shows a schematic cross section through semiconductor chips according to FIG. 10 after the external contacts on the semiconductor chips have been soldered onto the metal plate, FIG. 12 shows a schematic cross section through semiconductor chips according to FIG. 11 following the application of a plastic compound to the auxiliary carrier, FIG. 13 shows a schematic cross section through a blank with external contacts embedded in plastic compound, following removal of the auxiliary carrier, FIG. 14 shows a schematic cross section through a blank according to FIG. 13 with dividing regions for separating the component positions of the blank.

DETAILED DESCRIPTION

Figure 1:
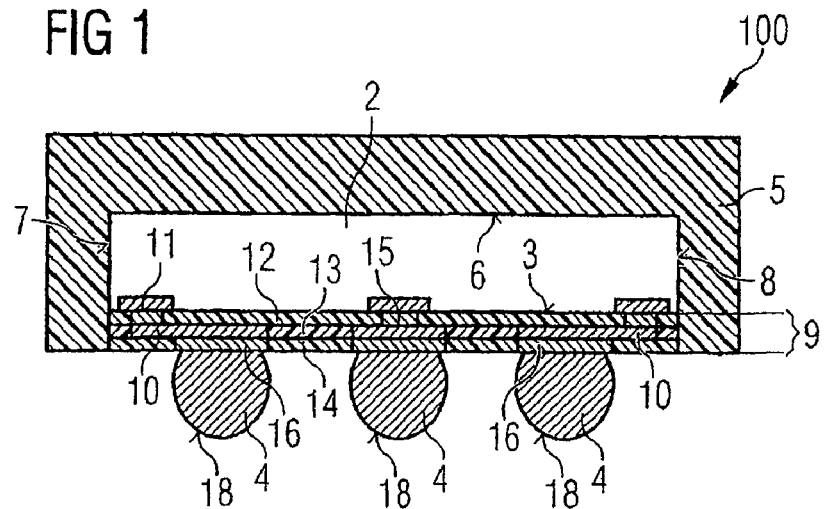
FIG. 1 shows a schematic cross section through a semiconductor component according to a first embodiment of the invention.

FIG. 1 shows a schematic cross section through a semiconductor component 100 according to a first embodiment of the invention. This semiconductor component 100 can be implemented in a semiconductor chip size. The semiconductor chip 2 itself can have an active upper side 3, which can be connected electrically to external contacts 4 arranged in the manner of a chip and belonging to the semiconductor component 100. In this first embodiment of the invention, the semiconductor chip 2 can be encapsulated by a plastic compound 5 on its rear side 6 and on its side edges 7 and 8, while the external contacts 4 can be arranged on external contact connecting areas 16 of a rewiring layer 9. The rewiring layer 9 can have three layers 12, 13 and 14. In this case, the layer 12 can be arranged directly on the active upper side 3 of the semiconductor chip. This upper side 3 can have contact areas 11. Contact areas 11 of this type on the active upper side 3 of a semiconductor chip 2 can be connected via conductor tracks, not shown, to electrodes of the integrated circuit of the semiconductor chip 2. These contact areas 11 can be designed with a relatively small area in relation to the external contact connecting areas for the external contacts 4. The rewiring layer 9 with its three layers 12, 13 and 14 can ensure that an electrical contact is maintained between contact areas 11 and external contact connecting areas 16. For this purpose, the first layer 12 can be built up from an insulating material, through which through contacts 15 lead at the positions of the contact areas. From the through contacts 15, it goes via rewiring lines 10 in the second layer 13 of the rewiring layer 9 directly to external contact connecting areas 16, the metallic structures of through contacts 15, rewiring lines 10 and external contact connecting areas 16 can be arranged in the second layer as a rewiring layer. The third layer of the rewiring layer 9, and therefore, the outer layer, can have an insulating material, which can protect the through contacts 15 and the rewiring lines 10 and can leave the region of the external contact connecting areas 16 free. Arranged on these external contact connecting areas 16 can be the external contacts 4 which, in this embodiment of the invention, can be, for example as solder balls. The exposed surface of the external contacts 4 can form a virtually spherical external contact area 18. This semiconductor component can be relatively the same size as the semiconductor chip. This size can be enlarged slightly by the plastic encapsulation on the rear side and on the side edges of the semiconductor chip. For this purpose, however, this semiconductor component 100 can be protected against mechanical and erosive damage on its rear side and on its side edges by a molded plastic compound including of an epoxy resin.

Figure 2:
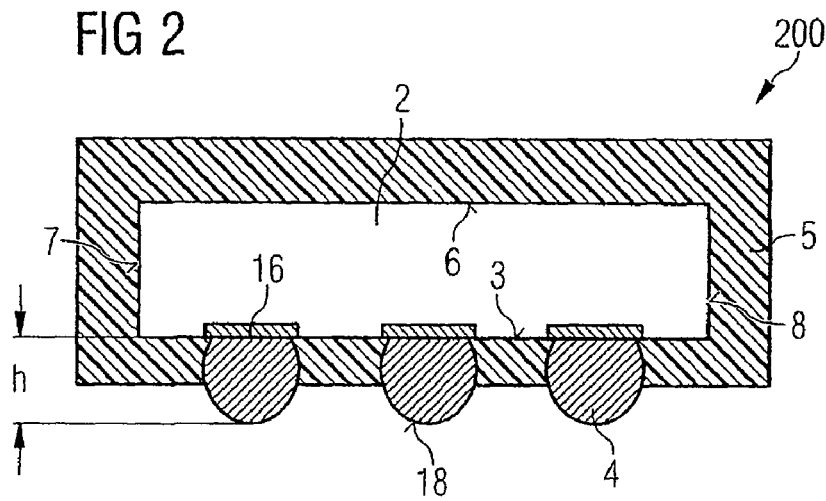
FIG. 2 shows a schematic cross section through a semiconductor component according to a second embodiment of the invention.

FIG. 2 shows a schematic cross section through a semiconductor component 200 according to a second embodiment of the invention. Components with the same functions as in FIG. 1 are identified by the same designations and not specifically explained.

The second embodiment of the invention according to FIG. 2 differs from the semiconductor component 100, which is shown in FIG. 1 in the fact that the external contacts 4 can have plastic compound thereon but, instead, at least half the height h of the external contacts 4 can be embedded in the plastic compound 5. In the case of this second embodiment of the invention, as a result of the partial embedding of the external contacts 4 in the plastic compound 5, the critical region of the transition from the external contact connecting area 16 to the external contact 4 can be reinforced mechanically. The shear stress on this critical region of an electronic component 200 can therefore be reduced and the reliability of the semiconductor component can be increased.

Figure 3:
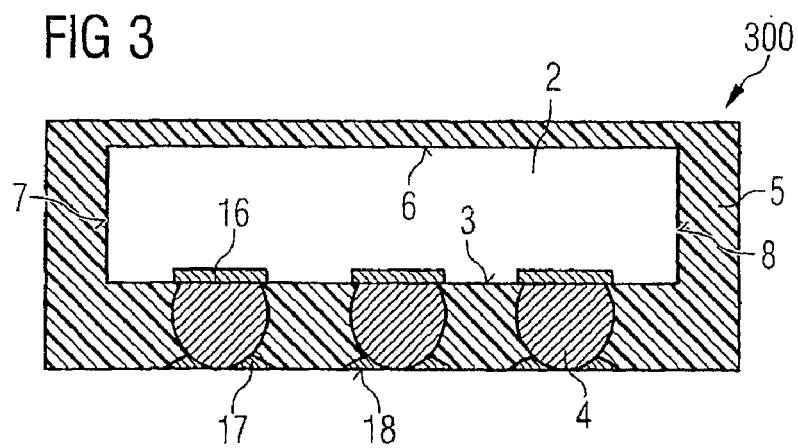
FIG. 3 shows a schematic cross section through a semiconductor component according to a third embodiment of the invention.

FIG. 3 shows a schematic cross section through a semiconductor component 300 according to a third embodiment of the invention. Components with the same functions as in the preceding figures are identified by the same designations and not specifically explained.

The third embodiment of the invention differs from the preceding embodiments in the fact that, firstly, the external contacts 4 can be embedded in plastic compound 5. Furthermore, each external contact can have a solder deposit 17, which can form an external contact area 18 and can make it easier to fit this electronic component to a primary circuit board. The rewiring layer shown in FIG. 1 is not shown again in FIGS. 2 and 3, instead, only the position of the external contact connecting areas 16 is indicated by corresponding bars.

Figure 4:
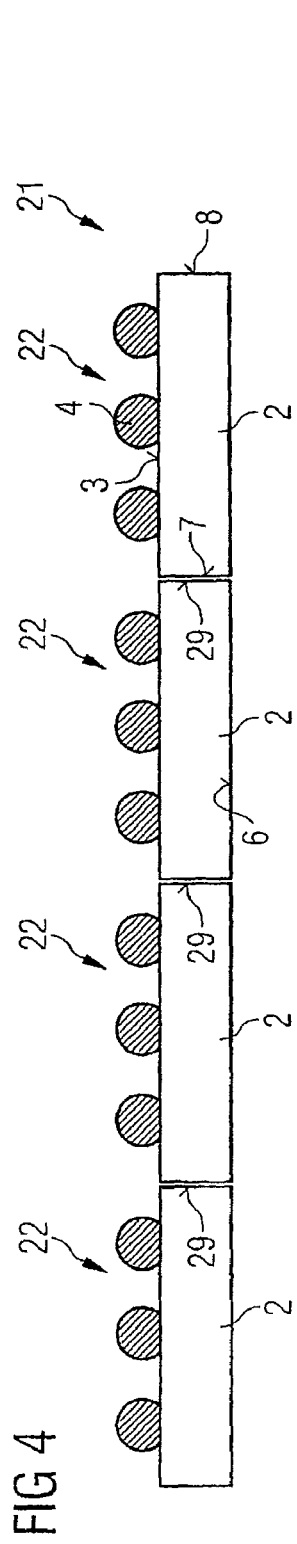
FIG. 4 shows a schematic cross section through a semiconductor wafer for producing a semiconductor component according to the invention.

FIG. 4 shows a schematic cross section through a semiconductor wafer 21 for producing a semiconductor component 100 or 200 according to the invention. A semiconductor wafer of this type can be made available and can have, in the appropriate chip positions 22, the elements including the external contacts 4, which can be prepared for production of a component according to the invention corresponding to the embodiments according to FIGS. 1 and 2. The semiconductor chip positions 22 can be arranged on the semiconductor wafer 21 in rows and columns, a small extract being shown in cross section here. The external contacts 4 can be applied to the semiconductor wafer last so that, after the semiconductor wafer has been cut up along the sawing tracks 29, individual semiconductor chips 2 can be available for further processing.

As the following figures show, these semiconductor chips 2 are processed further to form semiconductor components of semiconductor chip size.

Figure 5:
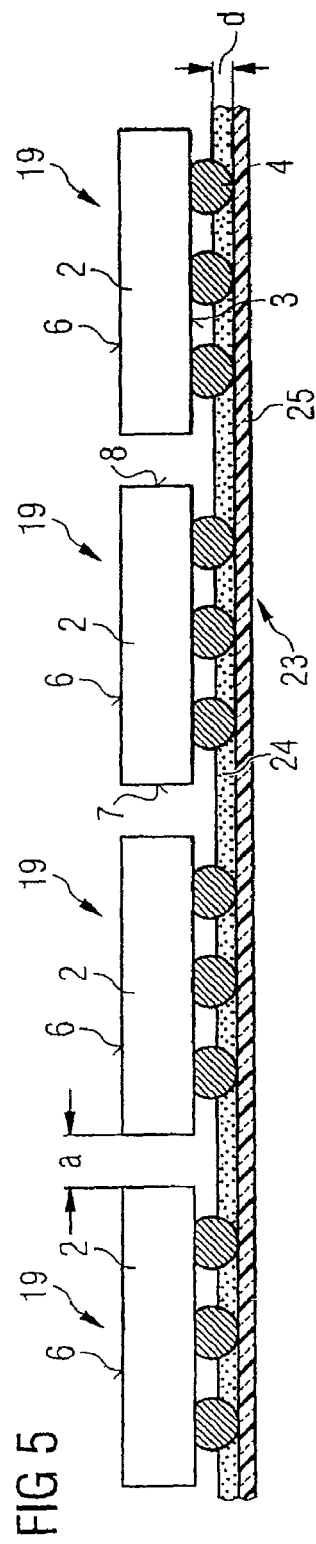
FIG. 5 shows a schematic cross section through semiconductor chips with external contacts on a plastic film with adhesive layer as auxiliary carrier.

FIG. 5 shows a schematic cross section through semiconductor chips 2 with external contacts 4 on a plastic film 25 with an adhesive layer 24 as auxiliary carrier 23. The semiconductor chips 2 can be pressed with their external contacts 4 into the adhesive layer 24 of the adhesive film 25 of the auxiliary carrier 23 in such a way that part of their surface can be covered by adhesive. In this case, the semiconductor chips 2 in the component positions 19 can be arranged in such a way that a spacing a between the semiconductor chips 2 is maintained which corresponds at least to twice a saw blade width required to separate the semiconductor components.

Figure 6:
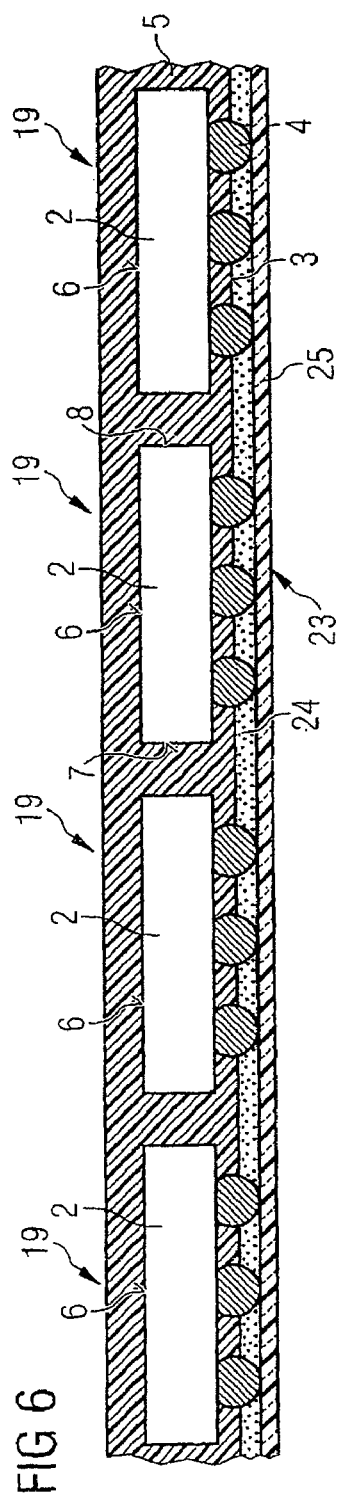
FIG. 6 shows a schematic cross section through semiconductor chips according to FIG. 5 following the application of a plastic compound to the auxiliary carrier.

FIG. 6 shows a schematic cross section through semiconductor chips 2 according to FIG. 5 following application of a plastic compound 5 to the auxiliary carrier 23. The plastic compound can fill the semiconductor chip with its external contacts, to the extent that the external contacts do not stick into the adhesive layer 24. Following the application of this plastic compound 5, the latter is cured so that a self-supporting composite board can be produced on the auxiliary carrier 23.

FIG. 7 shows a schematic cross section through semiconductor chips 2 according to FIG. 6 during the removal of the auxiliary carrier 23. Depending on the type of adhesive layer 24, the auxiliary carrier 23 can then be removed from, i.e., pulled off, this composite board, which represents a blank 20. The imprints of the external contacts 4 can remain in the adhesive layer 24. Pulling off such a film with adhesive layer can be made easier by the adhesive layer being warmed. As FIG. 7 shows, a self-supporting composite board can remain, which is available for further processing as a strip-like blank 20 or as a wafer blank with a circular contour. In this implementation of the method, the projecting height for the external contacts 4 from the plastic compound 5 can be set by the thickness d of the adhesive layer 24. The increasing thickness d of the adhesive layer 24 can thus be increased to such an extent that the entire height h of the external contacts remains free of plastic compound, it being possible for the first embodiment of the invention, as shown in FIG. 1, to be produced thereby.

FIG. 8 shows a schematic cross section through a blank 20 with external contacts 4 partly embedded in plastic compound 5. Components with the same functions as in the preceding figures are identified by the same designations and not specifically explained. The partial embedding of the external contacts 4 in the plastic compound 5 can be set by the thickness d, shown in FIG. 7, of the adhesive layer 24 shown there. The self-supporting composite board in the form of a blank 20 can then be divided into individual semiconductor components for each of the component positions 19 along the sawing tracks 28, which are represented by dashed lines, following the removal of the auxiliary carrier.

FIG. 9 shows a schematic cross section through a semiconductor wafer 21 for producing a semiconductor component 300 according to the third embodiment of the invention. Components which have the same functions as in the preceding figures are identified by the same designations and not specifically explained. The semiconductor wafer 21 for the third embodiment of the invention corresponds to the semiconductor wafer 21 which is shown in FIG. 4. Thus, the explanation of the further designations is rendered superfluous.

FIG. 10 shows a schematic cross section through semiconductor chips 2 with external contacts 4 on a metal plate 26 as auxiliary carrier 23. Instead of the plastic film used in the first and second embodiments of the invention, a metal plate 26 can be provided as the auxiliary carrier, on which the semiconductor chips 2 with their external contacts 4 can be arranged in component positions 19. The component positions 19 can be provided in rows and columns on the metal plate 26.

FIG. 11 shows a schematic cross section through semiconductor chips 2 according to FIG. 10 after the external contacts 4 of the semiconductor chips 2 have been soldered onto the metal plate 26. As the external contacts 4 are soldered onto the metal plate 26, solder deposits 17 can be produced around each of the external contacts 4. At the same time, each semiconductor chip can be fixed in the component position 19 as it is soldered on. With the soldering method, relatively precise and stable positioning of the semiconductor chips 2 in the component positions 19 on the metal plate 26 can be achieved.

FIG. 12 shows a schematic cross section through semiconductor chips 2 according to FIG. 11 following application of a plastic compound 5 to the auxiliary carrier 23. During this application of the plastic compound 5, the external contacts 4 can be encapsulated completely by plastic compound so that the entire semiconductor chip 2 with its external contacts can be embedded in the plastic compound 5. After the plastic compound 5 has cured, a self-supporting composite board can be produced, which can have a metal plate that short-circuits the external contacts 4 on its underside.

FIG. 13 shows a schematic cross section through a blank 20 with external contacts 4 embedded in plastic compound 5. This blank 20 has been produced by the metal plate 26, which is shown in FIG. 12, having been removed from the underside of the blank in the meantime. This removal can be achieved by wet or dry etching, use being made of the difference in the etching rate between the metal plate, which can be built up from a copper alloy, and the solder material, which can include a lead-free solder tin like a gold-tin alloy, in order to achieve a clear etch stop. Following removal of the metal plate, solder deposits 17, which can have exposed external contact areas 18, can be arranged on the underside of the blank 20.

FIG. 14 shows a schematic cross section through a blank 20 according to FIG. 13 with dividing regions 28 for separating the component positions 19 of the blank 20. By division along the dividing regions 28, this blank 20 can then be divided up into a plurality of individual semiconductor components of the third embodiment of the invention. These components can have solder deposits with external contact areas 18.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF DESIGNATIONS

1 Semiconductor component
2 Semiconductor chip
3 Active upper side of the semiconductor chip
4 External contact
5 Plastic compound
6 Rear side of the semiconductor chip
7 Side edge of the semiconductor chip
8 Side edge of the semiconductor chip
9 Rewiring layer, whose size corresponds to the semiconductor chip
10 Rewiring lines
11 Contact areas
12 First layer or insulating layer with through contacts
13 Second layer or rewiring layer with external contact connecting area
14 Third layer or insulating layer with windows for external contact connecting areas
15 Through contact
16 External contact connecting area
17 Solder deposit
18 External contact area
19 Component position
20 Blank
21 Semiconductor wafer
22 Semiconductor chip position
23 Auxiliary carrier
24 Adhesive layer
25 Plastic film
26 Metal plate 27 Solder deposit
28 Dividing region
29 Sawing tracks of the semiconductor wafer

We claim:

1. A semiconductor blank comprising:
an auxiliary carrier defining a plurality of component positions, wherein the auxiliary carrier includes a first carrier surface and a second carrier surface opposite the first carrier surface;
an adhesive layer applied to the first carrier surface; and
semiconductor components arranged in rows and columns on the auxiliary carrier, wherein each semiconductor component comprises a semiconductor chip including:
an active upper side, a rear side, and side edges, wherein the active upper side defines a plurality of external contact connecting areas, and
a plurality of external contacts disposed on the external contact connecting areas such that the external contacts project from the active upper side of the semiconductor chip to orient the active upper side in spaced relation from the auxiliary carrier, wherein the semiconductor chip is encapsulated by a plastic compound on the active upper side, the entire rear side and the side edges such that the external contacts are surrounded by the plastic compound,
wherein each external contact includes an exposed portion protruding from the plastic compound, the exposed portion being pressed into the adhesive layer such that each external contact is partially embedded into the adhesive layer, and
wherein the auxiliary carrier is separable from the semiconductor chip via the adhesive layer.

2. The semiconductor blank of claim 1, wherein the semiconductor components are spaced at dimensions corresponding to at least twice a saw blade thickness of a saw blade for dividing the blank into individual semiconductor components.

3. The semiconductor blank of claim 1, wherein:
the auxiliary carrier comprises:
a plastic film including a first film surface and a second film surface opposite the first film surface, and
the adhesive layer is applied to the first film surface; and
the semiconductor chip comprises a first chip surface and a second chip surface, wherein the external contacts are disposed on the first chip surface,
wherein the external contacts are each partially embedded into the adhesive layer to position the semiconductor chip over the auxiliary carrier.

4. The blank of claim 1, wherein:
the auxiliary carrier comprises a first carrier side and a second carrier side opposite the first carrier side; and
each external contact is fixed to the first side of the auxiliary carrier with a solder deposit.

5. The blank of claim 4, wherein the auxiliary carrier comprises a metal plate.

6. The semiconductor blank of claim 1, wherein the plastic compound is a cured compound that produces a self-supporting composite board on the auxiliary carrier.

7. The semiconductor blank of claim 1, wherein at least half the height of the external contacts is embedded in the plastic compound.

8. The semiconductor blank of claim 1, wherein the auxiliary carrier and the adhesive layer separate from the semiconductor chip as a unit.

9. A semiconductor blank comprising:
an auxiliary carrier including a first carrier surface and a second carrier surface opposite the first carrier surface; and
a layer of releasable adhesive applied to the first carrier surface; and
a semiconductor chip including:
an active side, a rear side, and side edges, a first chip surface and a second chip surface, and
a plurality of external contacts disposed on the first chip surface, wherein each of the external contacts are partially embedded into the adhesive layer to position the semiconductor chip over the auxiliary carrier;
a plastic compound surrounding the semiconductor chips such that the plastic compound encapsulates the semiconductor chip on the active upper side, the entire rear side and the side edges and the portion of the external contacts not embedded in the releasable adhesive,
wherein the releasable adhesive layer directly contacts the plastic compound and the external contacts, and wherein the releasable adhesive is separable from the plastic compound and the external contacts of the semiconductor chip.

10. The semiconductor blank of claim 9, wherein:
the auxiliary carrier comprises a plastic film defining the first carrier surface and the second carrier surface; and
the first chip surface is oriented in spaced relation from the first carrier surface.

11. The semiconductor blank of claim 9, wherein the semiconductor chips are arranged in component positions such that spacing between adjacent semiconductor chips corresponds at least to twice a saw blade width required to separate the semiconductor components.

12. The semiconductor blank of claim 9, wherein the plastic compound is cured to provide a self-supporting composite board on the auxiliary carrier.

* * * * *

UNITED STATES PATENT AND TRADEMARK OFFICE
CERTIFICATE OF CORRECTION

| | | |
|---|---|---|
| PATENT NO. | : 7,932,599 B2 | Page 1 of 1 |
| APPLICATION NO. | : 11/608981 | |
| DATED | : April 26, 2011 | |
| INVENTOR(S) | : Helmut Kiendl et al. | |

It is certified that error appears in the above-identified patent and that said Letters Patent is hereby corrected as shown below:

On the Title Page of the patent in the assignee header (73), the phrase "Sony Corporation (JP)" should be deleted and replaced with the phrase "Infineon Technologies AG (DE)"

Signed and Sealed this
Fourteenth Day of June, 2011

David J. Kappos
*Director of the United States Patent and Trademark Office*